(12) United States Patent
Zettl

(10) Patent No.: US 8,130,569 B1
(45) Date of Patent: Mar. 6, 2012

(54) NANOPARTICLE SHUTTLE MEMORY

(75) Inventor: Alex Karlwalter Zettl, Kensington, CA (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 200 days.

(21) Appl. No.: 12/768,251

(22) Filed: Apr. 27, 2010

(51) Int. Cl.
*G11C 7/00* (2006.01)

(52) U.S. Cl. .................. 365/189.16; 365/151; 365/156; 365/160; 977/943; 977/936; 977/938

(58) Field of Classification Search ............ 365/189.16, 365/151, 160, 156; 977/943, 938, 936
See application file for complete search history.

(56) References Cited

U.S. PATENT DOCUMENTS

| | | | | |
|---|---|---|---|---|
| 6,473,351 B2 * | 10/2002 | Tomanek et al. | ............. | 365/215 |
| 7,095,645 B2 * | 8/2006 | Pinkerton et al. | ............. | 365/151 |
| 7,245,520 B2 * | 7/2007 | Bertin et al. | .................. | 365/151 |
| 7,944,735 B2 * | 5/2011 | Bertin et al. | .................. | 365/156 |
| 7,986,546 B2 * | 7/2011 | Bertin et al. | .................. | 365/151 |

\* cited by examiner

*Primary Examiner* — Pho M Luu
(74) *Attorney, Agent, or Firm* — Michael J. Dobbs; Daniel D. Park; John T. Lucas

(57) ABSTRACT

A device for storing data using nanoparticle shuttle memory having a nanotube. The nanotube has a first end and a second end. A first electrode is electrically connected to the first end of the nanotube. A second electrode is electrically connected to the second end of the nanotube. The nanotube has an enclosed nanoparticle shuttle. A switched voltage source is electrically connected to the first electrode and the second electrode, whereby a voltage may be controllably applied across the nanotube. A resistance meter is also connected to the first electrode and the second electrode, whereby the electrical resistance across the nanotube can be determined.

20 Claims, 4 Drawing Sheets

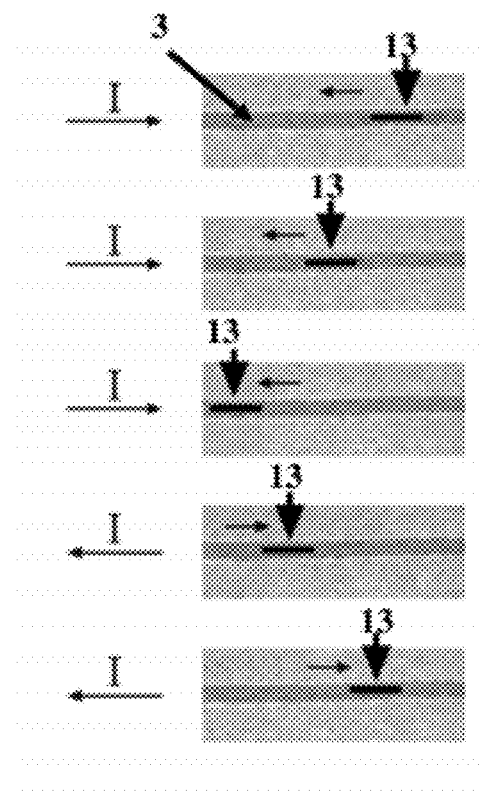
FIG. 2a
FIG. 2b
FIG. 2c
FIG. 2d
FIG. 2e
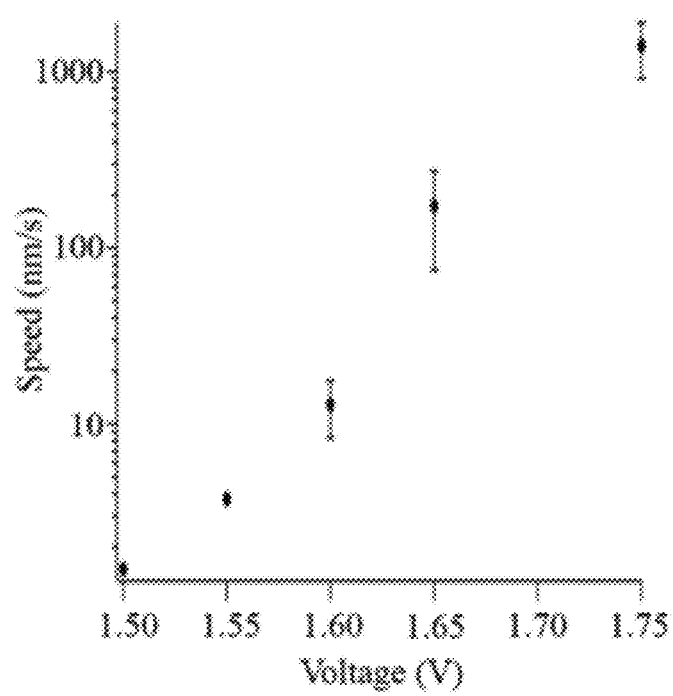
FIG. 2f

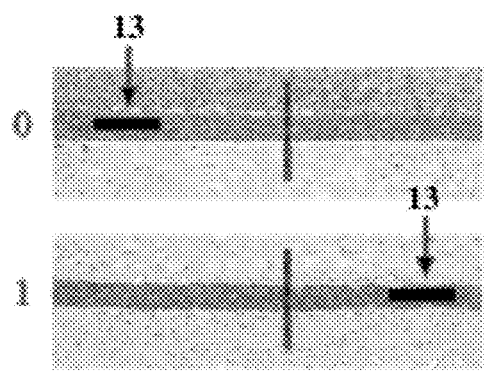
FIG. 3a
FIG. 3b
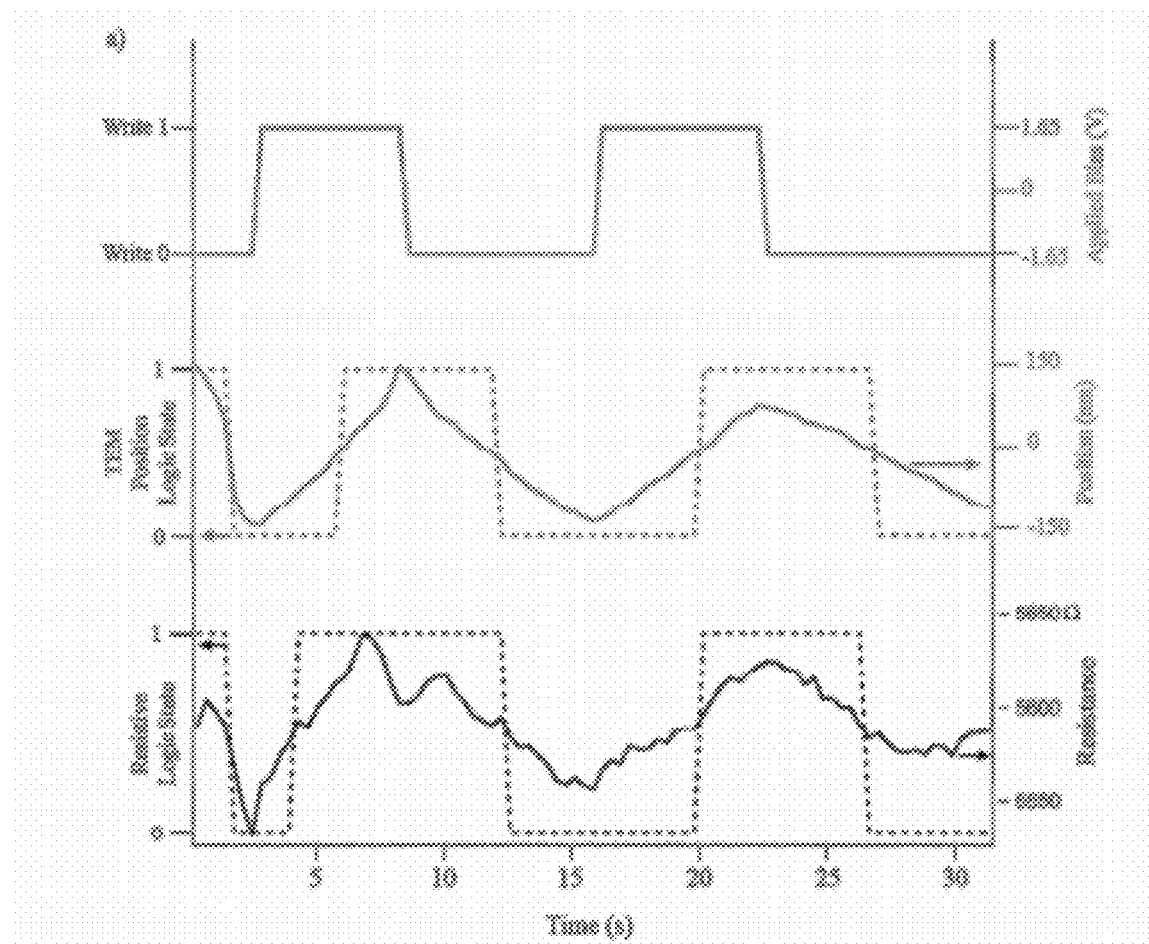
FIG. 3c

NANOPARTICLE SHUTTLE MEMORY

GOVERNMENT INTERESTS

The United States Government has rights in this invention pursuant to Contract No. DE-AC02-05CH11231, between the U.S. Department of Energy (DOE) and the University of California Berkeley.

CROSS-REFERENCE TO RELATED APPLICATIONS

1. Field of the Invention

The present invention relates to a method and device for long-term data storage. More particularly, the present invention relates to a method and device for long-term data storage using nanoparticle shuttle memory.

2. Background of the Invention

The miniaturization of nonvolatile silicon-based memory devices has revolutionized the creation, access, and exchange of digital information. There are tremendous benefits in continuing this miniaturization into the nanoscale. Unfortunately, a general trend for memory storage, independent of medium, is decreasing lifetime with increasing memory density. For example, stone carvings in the Karnak Temple in Luxor at an approximate density of 2 bits/in$^2$ are largely readable after 3,800 years, while information written with individual atoms by scanning tunneling microscopy manipulation at a density of ~100 Tbits/in$^2$ has an estimated lifetime of only 10 ps at room temperature.

Conventional digital memory configurations in use today, with densities on the order of 10-100 Gbits/in$^2$, have an estimated lifetime of only 10-30 years. Stored data is generally lost due to interaction between magnetic domains as well as material breakdown.

Interestingly, the Domesday Book, the great survey of England commissioned by William the Conqueror in 1086 and written on vellum, has survived over 900 years, while the 1986 BBC Domesday Project, a multimedia survey marking the 900th anniversary of the original Book, required migration from the original high-density laserdiscs within two decades because of media failure.

SUMMARY OF THE INVENTION

A device for storing data using nanoparticle shuttle memory having a nanotube. The nanotube having a first end and a second end. A first electrode is electrically connected to the first end of the nanotube. Likewise, a second electrode is electrically connected to the second end of the nanotube. The nanotube has an enclosed nanoparticle shuttle. A switched voltage source is electrically connected to the first electrode and the second electrode, whereby a voltage may be controllably applied across the nanotube. A resistance meter is also connected to the first electrode and the second electrode, whereby the electrical resistance across the nanotube can be determined.

In a preferred embodiment, a plurality of nanotubes is used to store any number of bits of data. Preferably, one or more resistance meters are each connected to a plurality of nanotubes via one or more read switches, thereby decreasing the amount of resistance meters required by the system and therefore costs, size and weight. Preferably, one or more voltage sources are each connected to a plurality of nanotubes via one or more write switches, thereby decreasing the amount of voltage sources required by the system and therefore costs, size and weight.

BRIEF DESCRIPTION OF THE DRAWINGS

FIG. 2*a-e* depicts a series of transmission electron microscopy (TEM) images of the nanotube with an enclosed nanoparticle shuttle (artificially emphasized for clarity).

FIG. 2*f* depicts the speed of the nanotube shuttle versus the voltage supplied to the first electrode and the second electrode across the nanotube.

FIG. 3*a* depicts a nanoparticle shuttle (artificially emphasized for clarity) positioned left of an image center, which can be defined as "0" for data storage purposes.

FIG. 3*b* depicts a nanoparticle shuttle (artificially emphasized for clarity) positioned right of an image center, which can be defined as "1" for data storage purposes.

FIG. 3*c* depicts the nanotube resistance (R) in relation to the position of the nanoparticle shuttle as measured by TEM imaging as the nanoparticle shuttle is continuously repositioned.

DETAILED DESCRIPTION OF THE INVENTION

Figure 1A:
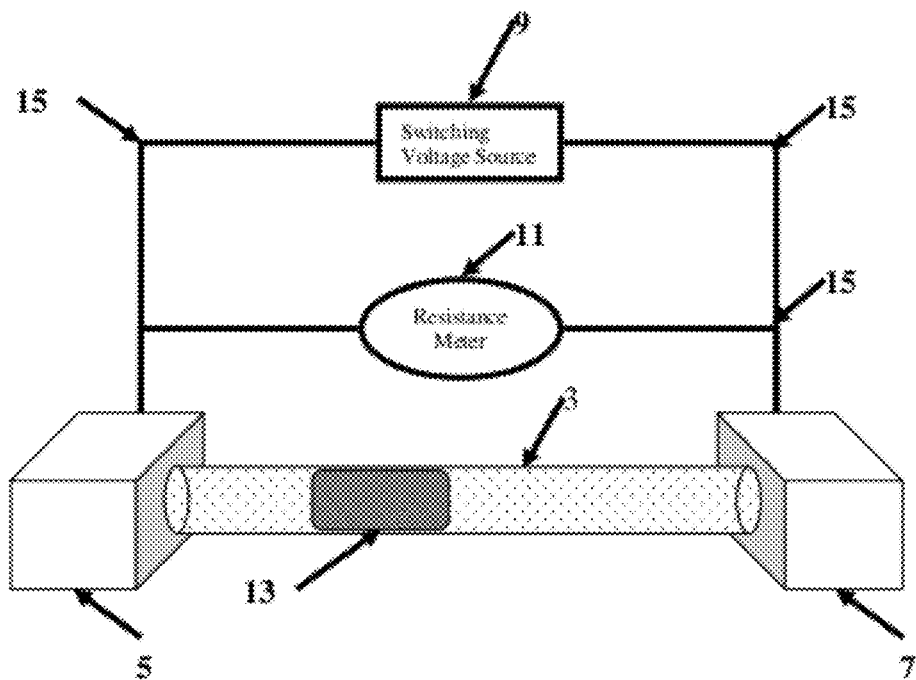
FIG. 1*a* depicts one embodiment of a nanoparticle shuttle memory device.

A device for storing data using nanoparticle shuttle memory having a nanotube. The nanotube having a first end and a second end. A first electrode is electrically connected to the first end of the nanotube. Likewise, a second electrode is electrically connected to the second end of the nanotube. The nanotube has an enclosed nanoparticle shuttle. A switched voltage source is electrically connected to the first electrode and the second electrode, whereby a voltage may be controllably applied across the nanotube. A resistance meter is also connected to the first electrode and the second electrode, whereby the electrical resistance across the nanotube can be determined.

Nanoscale Reversible Mass Transport for Archival Memory G. E. Begtrup, W. Gannett, T. D. Yuzvinsky, V. H. Crespi, and A. Zettl Nano Lett., 2009, 9 (5), 1835-1838, hereby fully incorporated by reference, describes on embodiment of Nanoparticle Shuttle Memory.

In a preferred embodiment, a plurality of nanotubes is used to store any number of bits of data. Preferably, one or more resistance meters are each connected to a plurality of nanotubes via one or more read switches, thereby decreasing the amount of resistance meters required by the system and therefore costs, size and weight. Preferably, one or more voltage sources are each connected to a plurality of nanotubes via one or more write switches, thereby decreasing the amount of voltage sources required by the system and therefore costs, size and weight.

In one embodiment, each bit is represented by a nanotube and each nanotube has a corresponding switched voltage source and resistance meter, whereby each nanotube can be read/written simultaneously. In an alternate embodiment, a single switched voltage source and a single resistance meter is connected via a switches to each nanotube. For example, in one embodiment a read switch is electrically connected to each nanotube and electrically connected to a resistance meter. Therefore, at the direction of a control system, the resistance of each nanotube may be read, however only one at a time. Likewise, a write switch is electrically connected to each nanotube and electrically connected to the switched voltage source. Therefore, at the direction of a control system, each nanotube may be written, however only one at a time.

In an alternate embodiment, a plurality of the nanotubes, but not all the nanotubes, is connected to a corresponding read switch. In this embodiment, a plurality of nanotubes is simultaneously read in groups using a plurality of resistance meters and read switches. Likewise, the plurality of the nanotubes, but not all the nanotubes, is connected to a corresponding write switch. In this embodiment, the plurality of nanotubes is simultaneously written in groups using a one or more voltages sources and write switches. Preferably, a single voltage source provides a suitable voltage for moving the nanoparticle shuttle, and the write switches are used to provide the voltage on demand to the nanotube at the desired polarity, thereby writing to the nanotube.

Preferably, a multiple of 8 nanotubes (8 bits) are selected by the read switch, write switch, or a combination thereof at once, thereby taking advantage of existing system optimizations used by existing other memory technologies (e.g. data transfer, paging, caching techniques). For example, in one embodiment, 8 nanotubes (8 bits) are written at once using a voltage source connected to the 8 nanotubes via one or more write switches. In one embodiment, 8 nanotubes (8 bits) are and read at once using 8 resistance meters each connected via one or more read switches. Alternately, any number of bits may be read or written at once using any number of write switches or read switches.

Preferably, a control system controls the read and writes operations of one or more nanotubes. Preferably, the control system comprises a microcontroller, ASIC (Application Specific Microcontroller), or a combination thereof. Preferably, the control system acts as a memory control for integration into existing computing systems.

FIG. 1

FIG. 1a depicts one embodiment of a nanoparticle shuttle memory device. As shown, a nanotube 3 has a first electrode 5 and a second electrode 7. The first electrode 5 and a second electrode 7 of the nanotube 3 are both electrically connected to a switching voltage source 9 and an electrical resistance meter 11 with one or more wires 15. The first electrode 5 of the nanotube 3 is electrically connected to the first end of the nanotube 3. Likewise, the second electrode 7 of the nanotube 3 is electrically connected to the second end of the nanotube 3. The nanotube 3 has an enclosed nanoparticle shuttle 13.

Figure 1B:
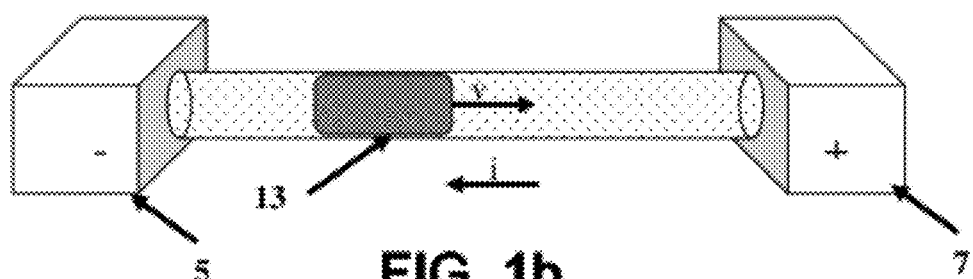
FIG. 1*b* depicts one embodiment of a nanoparticle shuttle memory device showing movement of the nanoparticle shuttle in a first direction.

FIG. 1b depicts one embodiment of a nanoparticle shuttle memory device showing movement of the nanoparticle shuttle 13 in a first direction. The switching voltage source 9 and the resistance meter 11 connected by one or more wires 15 are not shown in FIG. 1b for simplicity. As a voltage is produced across the first electrode 5 and the second electrode 7, inducing an electrical current (i), a force is induced on the nanoparticle shuttle 13 in a first direction within the nanotube 3, in the direction opposite of the electrical current.

Figure 1C:
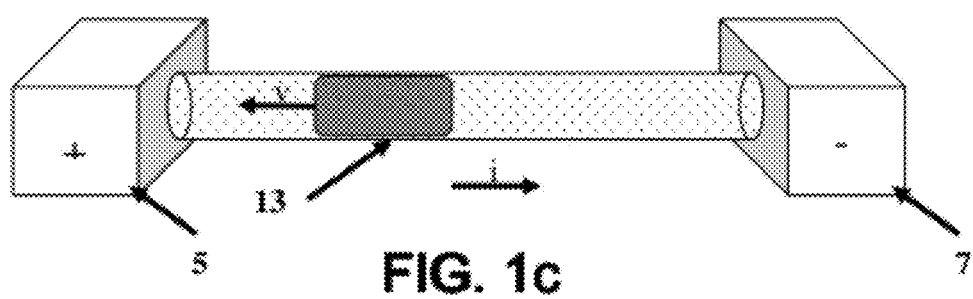
FIG. 1*c* depicts one embodiment of a nanoparticle shuttle memory device showing movement of the nanoparticle shuttle in a second direction.

FIG. 1c depicts one embodiment of a nanoparticle shuttle memory device showing movement of the nanoparticle shuttle 13 in a second direction. The switching voltage source 9 and the resistance meter 11 connected by one or more wires 15 are not shown in FIG. 1c for simplicity. FIG. 1c shows the effect of reversing the polarity in the embodiment shown in FIG. 1b, and thereby the direction of the nanoparticle shuttle 13. As a voltage is produced across the first electrode 5 and the second electrode 7, inducing an electrical current (i), a force is induced on the nanoparticle shuttle 13 in a second direction within the nanotube 3, in the direction opposite of the electrical current.

The Nanotube 3

The nanotube 3 is any nanotube, preferably a multiwall or single wall electrically conducting nanotube comprised of carbon, or of BxCyNz alloy, or of transition metal dichalcogenide, for example $MoS_2$ or $TaS_2$. Preferably, the nanotube 3 has an inner diameter from 0.5 nm to 100 nm, and a length greater than and including 5 nm. Preferably, the nanotube 3 has an inner diameter from 0.5 nm to 100 nm, and a length from 5 nm to 1 mm. Preferably, the nanotube 3 is created by arc discharge, laser ablation, high pressure carbon monoxide (HiPCO), chemical vapor deposition (CVD), or any other means. In one embodiment, the nanotube 3 is constructed by the method described in B. C. Satishkumar, A. Govindaraj, C. N. R. Rao, Bundles of aligned carbon nanotubes obtained by the pyrolysis of ferrocene-hydrocarbon mixtures: role of the metal nanoparticles produced in situ, Chemical Physics Letters, Volume 307, Issues 3-4, 2 Jul. 1999, Pages 158-162, ISSN 0009-2614, DOI: 10.1016/S0009-2614(99)00521-7, hereby fully incorporated by reference.

In one embodiment, a nanotube 3 having an enclosed iron nanoparticle 5 was fabricated in a single step via pyrolysis of ferrocene in argon at 1000° C. The nanotube was then ultrasonically dispersed in isopropanol and deposited onto a substrate. For diagnostic purposes, a custom fabricated silicon nitride membrane compatible with transmission electron microscopy (TEM) was used as a substrate. In the alternative any rigid structure may be used as a substrate, for example, silicon, steel, plastics, etc. The device was created in one lithographic step. The first electrode and second electrodes were both pattered and 100 nm of palladium was deposited and lifted off in acetone. The planar devices on the substrate were then mounted inside a TEM biasing staging allowing for high-resolution imagining in real time during device operation.

The Enclosed Nanoparticle Shuttle 13

The enclosed nanoparticle shuttle 13 is a nanoparticle, preferably having a size less than a micrometer. Preferably, the nanoparticle shuttle 13 comprises transition metals including Fe, V, Nb, Ta, Ti, Hf, Zr, Co, and In, Ga (liquid or molten state), and oxides including Fe—O, Zr—O, Hf—O, Al—O, and alkali halides including KCl RbCl, and NaCl, or a combination thereof. In a preferred embodiment, the nanoparticle shuttle 13 is made of iron. Preferably, the nanoparticle shuttle 13 is constructed with the nanotube 3, for example by using the method described in by the method described in B. C. Satishkumar, A. Govindaraj, C. N. R. Rao, Bundles of aligned carbon nanotubes obtained by the pyrolysis of ferrocene-hydrocarbon mixtures: role of the metal nanoparticles produced in situ, Chemical Physics Letters, Volume 307, Issues 3-4, 2 Jul. 1999, Pages 158-162, ISSN 0009-2614, DOI: 10.1016/S0009-2614(99)00521-7, hereby fully incorporated by reference.

The First Electrode 5 and the Second Electrode 7

The First Electrode 5 and the Second Electrode 7 are both made of one or more electrically conducting materials. In one embodiment, the First Electrode 5 and the Second Electrode 7 are both simply the connection of the one or more wires 15 to the nanotube 3 and the respective components (e.g. the switching voltage source 9 and the resistance meter 11). However, due to the small size of the nanotube 3, preferably, the First Electrode 5 and the Second Electrode 7 are both electrically conductive materials on the first end and second end of the nanotube 3, respectively. In a preferred embodiment, the First Electrode 5 and the Second Electrode 7 are both made of a metal, for example, but not limited to: Zinc, Molybdenum, Cadmium, Titanium, Chromium, Manganese, Iron, Cobalt, Nickel, Copper, Rhodium, Palladium, Silver, Tungsten, Platinum, Gold, Mercury, or a combination thereof. In a preferred embodiment, the First Electrode 5 and the Second Electrode 7 are both made of palladium.

The Switching Voltage Source 9

The switching voltage source 9 is any voltage supply means capable of producing a voltage high enough to move the nanoparticle shuttle 13 within the nanotube 3 when desired. In one embodiment, the switching voltage source is a batter, or a power supply connected to an electrical power grid.

In one embodiment, the switching voltage source 9 comprises a voltage supply source and a switch, whereby the voltage supply source supplies a constant voltage and is electrically connected to the first electrode 5 and the second electrode 7 by one or more switches, which allow a voltage to produced across the nanotube 3 at either polarity.

Preferably, the switching voltage source 9 is controlled to a control system. In one embodiment, a constant supply source supplies power to an integrated circuit, ASIC (Application Specific Integrated Circuit), or a microcontroller, which selectably produces a signal for a time period. For example, in one embodiment, a square wave is sent across the first electrode 5 and the second electrode 7 providing a voltage of at least 1.5 volts for about 5 seconds. Preferably, the voltage is selected based upon the nanoparticle shuttle 13 material and size, as well as any resistance to movement by the nanotube 3 (e.g. friction). Preferably, the time period of the supplied voltage is selected based upon the length of the nanotube 3 and the speed of the nanoparticle 13 (based upon the voltage supplied).

For embodiments having a plurality of nanotubes, a single voltage source preferably provides a suitable voltage for moving a nanoparticle shuttle, and write switches are used to provide the voltage on demand to the nanotube at the desired polarity, thereby writing to a nanotube. A switch allows a single voltage source to controllably supply a voltage to a plurality of nanotubes (simultaneous or nonconcurrently). In a preferred embodiment, each nanotube has a corresponding one or more switches, which allow each nanotube to be controllably connected to the desired polarity of the voltage source. In another embodiment, each nanotube is connected to one or more multiplexing switches thereby allowing each nanotube to be controllably connected to the desired polarity of the voltage source.

The write switch is preferably any electrical or mechanical means of switching, for example relays, BJTs, MOSFETs, Solid-State Relays, etc.

The Electrical Resistance Meter 11

The electrical resistance meter 11 measures the electrical resistance across the first electrode 5 and the second electrode 7 of the nanotube 3. The electrical resistance meter 11 produces a voltage/current less than the switching voltage source 9, whereby the state of the nanoparticle shuttle 13 is not altered by the electrical resistance meter 11.

In a preferred embodiment, the electrical resistance meter 11 is a connected to one or more electrical resistors in series to a voltage source producing a known voltage, as a voltage divider. The electrical resistance of the nanotube 3 and the other resistors connected in series is then directly proportional to their respective voltages. As the voltage can be determined or measured, and the resistance of the components, except for the nanotube 3 can be predetermined, the resistance of the nanotube 3 can therefore be determined.

For example, if a single resistor is electrically connected in series with the nanotube 3, then the resistance of the nanotube 3 can be determined as Eq. 1, where $R_1$ is the resistance of the single resistor, $V_1$ is the voltage across the single resistor and $V_{nanotube}$ is the voltage across the nanotube (measured by the voltage between the first electrode 5 and the second electrode 7, and $R_{nanotube}$ is the resistance of the nanotube (directly related to the position of the nanoparticle shuttle 13. If the voltage ($V_s$) of the voltage source is known, then the equation can be simplified by using the voltage of the source and the voltage ($V_{nanotube}$) determined across the nanotube 3 as shown in Eq. 2 to calculate Eq. 3:

$$R_{nanotube} = \frac{V_{nanotube} R_1}{V_1} \qquad \text{Eq. 1}$$

$$V_1 = V_{source} - V_{nanotube} \qquad \text{Eq. 2}$$

$$R_{nanotube} = \frac{V_{nanotube} R_1}{V_s - V_{nanotube}} \qquad \text{Eq. 3}$$

For embodiments having a plurality of nanotubes, each nanotube 3 preferably has a corresponding one or more read switches, which allow each nanotube 3 to be controllably connected to one or more electrical resistance meters 11. Preferably, each nanotube 3 is connected to one or more multiplexing switches thereby allowing each nanotube 3 to be controllably connected to electrical resistance meter 11.

The read switch is preferably any electrical or mechanical means of switching, for example relays, BJTs, MOSFETs, Solid-State Relays, etc.

The One or More Wires 15

The one or more wires 15 are any electrically conducting means of connecting the various components. Preferably, the one or more wires 15 are one or more metal wires.

FIG. 2a-e

FIG. 2a-e shows a series of transmission electron microscopy (TEM) images of the nanotube 3 with an enclosed nanoparticle shuttle 13 (artificially emphasized for clarity). The first electrode and second electrode were positioned outside the field of view of the TEM. Upon application of an electrical current across the first electrode 5 and second electrode 7 through the nanotube 3, the enclosed nanoparticle shuttle 13 moves via electromigration forces in a first direction (opposite from the direction of the electrical current), as shown in FIG. 2a-c. TEM observation indicates that the enclosed nanoparticle shuttle 13 is crystalline throughout the shuttling process. As the current direction is reversed, the direction of motion for the enclosed nanoparticle shuttle 13 was reversed, as shown in FIG. 2d-e. Dropping the current to zero rapidly quenches the enclosed nanoparticle shuttle 13 motion, thereby freezing its position.

The speed of the enclosed nanoparticle shuttle 13 can be tuned over several orders of magnitude by varying the applied bias voltage (V), as shown in FIG. 2f. FIG. 2f depicts the speed of the nanotube shuttle 13 versus the voltage supplied between the first electrode 5 and the second electrode 7 across the nanotube 3. Just beyond a threshold for the onset of motion at V~1.55 V, the nanoparticle shuttle 13 moved at a rate of ~1 nm/s, on the order of the speed of slow continental drift, while at 1.75 V, the highest bias applied to this device, the nanoparticle shuttle 13 moved at 1.4 µm/s, comparable to the speed of the motor protein myosin. In other embodiments it was observed that the nanoparticle shuttle 13 velocity can be increased by at least 4 orders of magnitude beyond this, exceeding 2.5 cm/s, the maximum speed detectable at high magnification due to the frame rate of the TEM video camera used during experimentation. The true top speed could be considerably higher. In addition to continuously translating the nanoparticle shuttle 13, the nanoparticle shuttle 13 motion can be precisely "stepped". Application of a short (~20 ns) voltage pulse on the order of 2V causes the nanoparticle shuttle 13 to translate 3 nm.

Successive pulses induce successive translations analogous to, but an order of magnitude more precise than, the walking motion of myosin VI, which moved in 36 nm steps along an actin filament. The combination of static biasing and pulsing allows precision control of the nanoparticle shuttle 13 position from the microscale to the nanoscale. The nanoparticle shuttle 13 motion was dictated strictly by the applied dc bias, irrespective of the presence or absence of the TEM imaging electron beam.

The different nanoparticle shuttle 13 position states, as shown in FIG. 3a and FIG. 3b, clearly serve as digital memory. If the position left of image center is defined as "0", as shown in FIG. 3a, and right of image center is defined as "1", as shown in FIG. 3b, then a desired logic state can be written by application of a voltage pulse, of suitable polarity and sufficient duration, which physically positions the nanoparticle shuttle 13. Preferably, the control system is either preprogrammed with the resistance measurements for two or more positions (e.g. FIG. 3a and FIG. 3b), or a control system determines two or more positions dynamically. For example, the control system could supply various voltages across said nanotube and read out the resulting electrical resistance across said nanotube verifying stability. However, for constancy of data, optimal states are determined and preprogrammed in the control system.

While interesting from a diagnostic point of view, using TEM to read out the state of the device is clearly impractical. Most desirable would be a simple two-terminal electrical readout using the first electrode 5 and the second electrode 7. It was determined that the axial electrical resistance of the nanotube 3, measured by the resistance meter 11, is sensitive to the physical location of the nanoparticle shuttle 13.

In FIG. 3c shows the nanotube resistance (R) as the nanoparticle shuttle 13 is continuously repositioned. Although some noise is apparent, FIG. 3c demonstrates that R tracks the TEM-determined position coordinate remarkably well. With the discrimination similar to that used for TEM positioning, the logic states are thus faithfully read out from blind resistance measurements by the resistance meter 11 alone.

Figure 4:
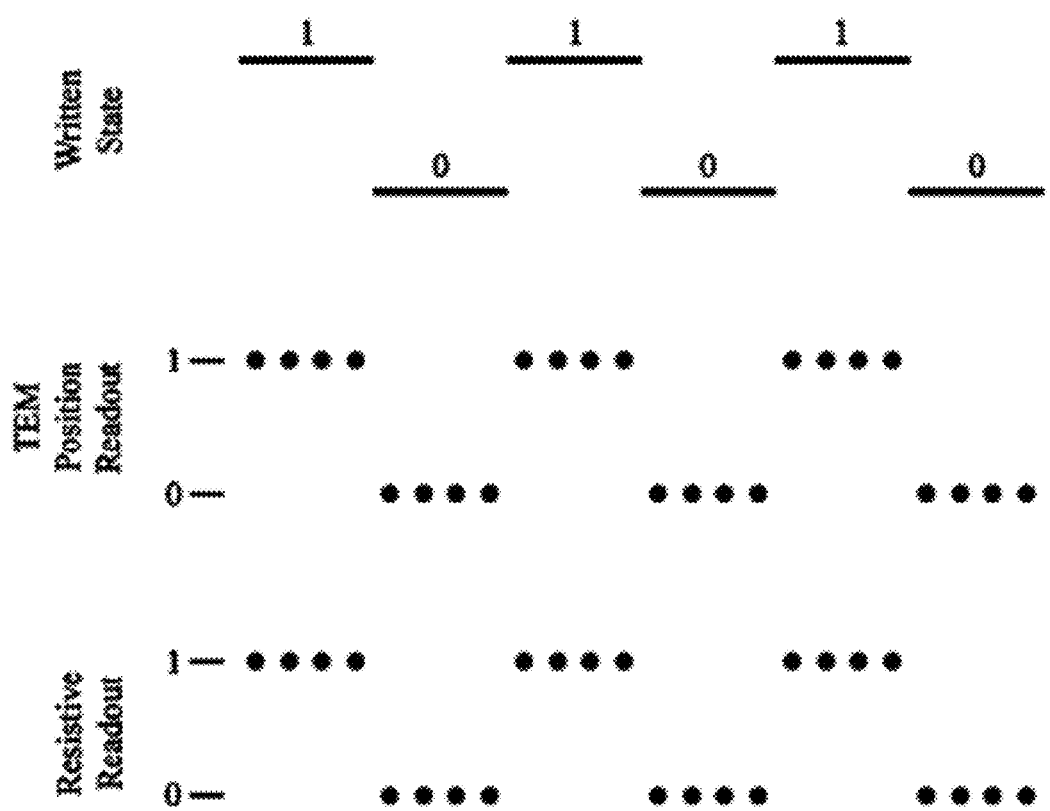
FIG. 4 depicts the representative data "101010" having been sequentially written to the device and read out in succession four times for each written state.

Importantly, probing the state of the system via small voltage pulses is nonperturbative and does not alter the nanoparticle shuttle 13 position; hence the memory electrical readout is nondestructive. This is demonstrated in FIG. 4, where the states 101010 have been sequentially written to the device and read out in succession four times for each written state.

Both the TEM-determined position state and the resistively determined state are in agreement, with no state destruction cause by readout. Due to the two-terminal configuration, such memory devices could be scaled to produce memory densities ~1 Tbit/in$^2$, greater than current state of the art hard drive storage, with memory density ~200 Gbit/in$^2$. The shuttle memory density could be increased by another order of magnitude or more by applying multiple thresholds to store many states per device.

The unique geometry afforded by the nanoparticle shuttle 13 naturally yields a hermetically sealed system, immune to environmental contamination. Therefore, the information in the shuttle memory is only compromised if the nanoparticle shuttle 13 moves.

The readout mechanism is tied to the electrical resistance of the nanotube 3, which is itself a subject of much speculation and controversy. Experimentation demonstrated that the nanoparticle shuttle 13, despite residing entirely within the core of the nanotube 3, serves as a position-dependent scattering center. In a model of on-tube transport with intershell coupling, the nanoparticle shuttle 13 could locally alter intershell coupling as well as influence quantum interference of electron wave functions along the tube. If the electronic transport is diffusive, the system may be in part modeled as regions of materials with different resistivities. Position dependence in the total resistance could then come from spatial variations in the resistivity of the nanotube 3 (caused by defects) or simply by geometric effects. If the transport is in the ballistic regime over limited segments, local resistance changes could be due to electron resonance effects.

Irrespective of the details of the electron conduction mechanism along the nanotube 3, it was modeled the transport of the nanoparticle shuttle 13 under electromigration occurred within a biased sawtooth potential with thermally activated hops between local minima separated by a distance (L), assuming rapid equilibration within each local minimum. The unbiased (i.e., V=0) barrier between minima is ΔE; the attempt rate is ω; the voltage across the nanotube 3 is V. The length of the nanotube 3 is D, so V/D is the average electric field. The nanoparticle shuttle 13 speed is then Eq. 4

$$V \sim \omega L e^{-(\Delta E - (1/2) Q_{eff} V(L/D))/kT}$$ Eq. 3 where the effective charge $Q_{eff}$ measures the strength of the coupling between the nanoparticle shuttle 13 and the external electric field. Since $Q_{eff}$ embodies not just the direct coupling of charge to the local electric field but also any effect of charge carrier scattering events, it cannot be directly identified with the total charge on the nanoparticle shuttle 13. For structurally well-ordered nanotube 3 walls, the order-of-magnitude distance L for a rigid nanoparticle shuttle 13 is bounded below by the body center cubic (bcc) iron or graphenic lattice constant, both on the order of 2 Å, since this sets the repeat distance for axial (achiral) or helical (chiral) motions.

For less-ordered nanotubes 3 wherein motion of nanoparticle shuttle 13 is pinned at structural imperfections, the characteristic step distance would be set by the separation between pinning sites; the ability experimentally to reduce the step size to ~3 nm sets an upper limit on the importance of such disorder. Finally, depending on the elastic relaxation of the nanoparticle shuttle 13, hopping events may involve motions of Frenkel-Kontorova domain walls that are internal to the nanoparticle shuttle 13. The observed exponential dependence of the speed on the applied voltage (shown in FIG. 1g), $d(\log_{10} V)/dV \sim 30$ V$^{-1}$, sets $Q_{eff} L/D \sim 1.5$ electron charges (independent of ΔE, ω, or kT). The attempt rate w estimated from the center-of-mass vibration of the nanoparticle shuttle 13 ($\sim 10^9 \text{ s}^{-1}$) is smaller than is typical for molecular-scale hopping ($10^{12}\text{s}^{-1}$) since the nanoparticle shuttle 13 is much heavier. However, the dependence of the barrier height on the attempt rate (and the step length) is only logarithmic.

The interface between a well-ordered nanotube 3 inner wall and an incommensurate crystalline nanoparticle shuttle 13 (Fe in experiments) is expected to be relatively smooth, as required to obtain electromigratory motion at realistic currents, but nevertheless kinetic barriers against stick-slip motion can be large compared to room temperature thermal energies as demonstrated by the lack of observable motion in the undriven system. Making a conservative assumption of room-temperature operation within the TEM, the measured nanoparticle shuttle 13 speeds place a lower bound of $\Delta E \sim 1.5\text{-}1.7$ eV on the barrier height. Additional mechanisms for surmounting the kinetic barrier against motion, such as athermal fluctuations caused by electron scattering events or a rapid ballistic passage over multiple successive barriers under electromigration, would tend to increase the estimate for the barrier size and hence further stabilize the undriven system against purely thermal diffusive wandering. The precise value of the barrier, and the resulting nanoparticle shuttle 13 speeds, may be sensitive to detailed structural parameters, such as the wrapping indices of the inner wall and the orientation of the lattice with respect to the axis of the nanotube 3.

To determine the lifetime of the memory device, we consider the motion of the nanoparticle shuttle 13 at room temperature and zero bias over an appreciable enough distance to cause loss of information (here, 200 nm). The estimated barrier then yields a room-temperature dwell time greater than $3.3 \times 10^{17}$s. Although truly archival storage is a global property of an entire memory system, the first inescapable requirement for such a system is that the underlying mechanism of information storage for individual bits must exhibit a persistence time much longer than the envisioned lifetime of the resulting device. A single bit lifetime in excess of a billion years demonstrates that this system has the potential to store information stably for any practical desired archival time scale. Thus, nanoscale electromechanical memory devices such as those described here present a new solution to ultra-high density, archival data storage.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

All publications and patent documents cited in this application are incorporated by reference in their entirety for all purposes to the same extent as if each individual publication or patent document were so individually denoted.

Any element in a claim that does not explicitly state "means for" performing a specified function, or "step for" performing a specific function, is not to be interpreted as a "means" or "step" clause as specified in 35 U.S.C. §112, ¶ 6. In particular, the use of "step of" in the claims herein is not intended to invoke the provisions of 35 U.S.C. §112, ¶ 6.

The invention claimed is:

1. A device for storing data using nanoparticle shuttle memory comprising:
   a) a nanotube having a first end and a second end;
   b) said nanotube comprising an enclosed nanoparticle shuttle;
   c) a first electrode electrically connected to said first end of said nanotube;
   d) a second electrode electrically connected to said second end of said nanotube;
   e) a switched voltage source electrically connected to said first electrode and said second electrode, whereby a voltage may be controllably applied across said nanotube;
   f) a means for determining the location of said nanoparticle within said nanotube;
   g) a control system connected to said means for determining the location of said nanoparticle and said switched voltage source; and
   h) said control system comprising a means for storing and retrieving data using the location of said nanoparticle within said nanotube.

2. The device for storing data using nanoparticle shuttle memory of claim 1 whereby said means for determining the location of said nanoparticle within said nanotube comprising:
   a) a resistance meter electrically connected to said first electrode and said second electrode, whereby the electrical resistance across said nanotube can be determined.

3. The device for storing data using nanoparticle shuttle memory of claim 2 further comprising:
   a) a plurality of said nanotube; and
   b) each said nanotube comprising said first electrode, said second electrode, said switched voltage source, and said resistance meter.

4. The device for storing data using nanoparticle shuttle memory of claim 2 further comprising:
   a) a plurality of said nanotube;
   b) said switched voltage source comprising a voltage source and one or more write switches;
   c) said voltage source electrically connected to said first electrode and said second electrode of each said nanotube via said one or more write switches; and
   d) said resistance meter electrically connected to said first electrode and said second electrode of each said nanotube via one or more read switches.

5. The device for storing data using nanoparticle shuttle memory of claim 2 further comprising:
   a) a plurality of said nanotube;
   b) said switched voltage source comprising a voltage source and one or more write switches;
   c) said voltage source electrically connected to said first electrode and said second electrode of each said nanotube via said one or more write switches; and
   d) a plurality of said resistance meter electrically each connected to said first electrode and said second electrode of a corresponding nanotube via one or more read switches.

6. The device for storing data using nanoparticle shuttle memory of claim 1 further comprising:
   a) said nanoparticle shuttle comprises Fe, V, Nb, Ta, Ti, Hf, Zr, Co, In, Ga, Fe—O, Zr—O, Hf—O, Al—O, KCI, RbCI, NaCI, or a combination thereof.

7. The device for storing data using nanoparticle shuttle memory of claim 6 further comprising:
   a) said first electrode and the second electrode each comprising a metal from the group of metals consisting of: Zinc, Molybdenum, Cadmium, Titanium, Chromium, Manganese, Iron, Cobalt, Nickel, Copper, Rhodium, Palladium, Silver, Tungsten, Platinum, Gold, Mercury, or a combination thereof; and
   b) said nanotube comprising a carbon $B_xC_yN_z$ alloy, or a transition metal dichalcogenide.

8. The device for storing data using nanoparticle shuttle memory of claim 7 further comprising:
   a) said nanotube has an inner diameter from 0.5 nm to 100 nm, and a length greater than and including 5 nm.

9. The device for storing data using nanoparticle shuttle memory of claim 8 further comprising:
   a) said voltage source producing a voltage of at least 1.55 volts; and
   b) said nanotube has an inner diameter from 0.5 nm to 100 nm, and a length from 5 nm to 1 mm.

10. The device for storing data using nanoparticle shuttle memory of claim 9 further comprising:
   a) said means for determining the location of said nanoparticle within said nanotube comprising a resistance meter electrically connected to said first electrode and said second electrode, whereby the electrical resistance across said nanotube can be determined;
   b) a plurality of said nanotube;
   c) said switched voltage source comprising a voltage source and one or more write switches;
   d) said voltage source electrically connected to said first electrode and said second electrode of each said nanotube via said one or more write switches; and
   e) said resistance meter electrically connected to said first electrode and said second electrode of each said nanotube via one or more read switches.

11. The device for storing data using nanoparticle shuttle memory of claim 9 further comprising:
   a) said means for determining the location of said nanoparticle within said nanotube comprising a resistance meter electrically connected to said first electrode and said second electrode, whereby the electrical resistance across said nanotube can be determined;
   b) a plurality of said nanotube;
   c) said switched voltage source comprising a voltage source and one or more write switches;
   d) said voltage source electrically connected to said first electrode and said second electrode of each said nanotube via said one or more write switches; and
   e) a plurality of said resistance meter electrically each connected to said first electrode and said second electrode of a corresponding nanotube via one or more read switches.

12. The device for storing data using nanoparticle shuttle memory of claim 1 further comprising:
   a) said nanoparticle shuttle comprises Fe.

13. The device for storing data using nanoparticle shuttle memory of claim 1 further comprising:
   a) said nanotube comprising a carbon BxCyNz alloy, or a transition metal dichalcogenide.

14. The device for storing data using nanoparticle shuttle memory of claim 1 further comprising:
   a) said nanotube comprising $MoS_2$ or $TaS_2$.

15. The device for storing data using nanoparticle shuttle memory of claim 1 further comprising:
   a) said nanotube has an inner diameter from 0.5 nm to 100 nm, and a length greater than and including 5 nm.

16. The device for storing data using nanoparticle shuttle memory of claim 1 further comprising:
   a) said nanotube has an inner diameter from 0.5 nm to 100 nm, and a length from 5 nm to 1 mm.

17. The device for storing data using nanoparticle shuttle memory of claim 1 further comprising:
   a) said first electrode and the second electrode each comprising a metal from the group of metals consisting of: Zinc, Molybdenum, Cadmium, Titanium, Chromium, Manganese, Iron, Cobalt, Nickel, Copper, Rhodium, Palladium, Silver, Tungsten, Platinum, Gold, Mercury, or a combination thereof.

18. The device for storing data using nanoparticle shuttle memory of claim 1 further comprising:
   a) said first electrode and the second electrode each comprising Palladium.

19. The device for storing data using nanoparticle shuttle memory of claim 1 further comprising:
   a) said voltage source producing a voltage of at least 1.55 volts.

20. A method of storing data using the nanoparticle shuttle memory of claim 1 comprising:
   a) constructing one or more of the device of claim 1;
   b) defining a first position of said nanoparticle representing a first logic state;
   c) determining the electrical resistance of said nanotube when said nanoparticle is in said first position, representing said first logic state;
   d) defining a second position of said nanoparticle representing a second logic state;
   e) determining the electrical resistance of said nanotube when said nanoparticle is in said second position, representing said second logic state;
   f) applying a voltage across said nanotube;
   g) detected the electrical resistance of said nanotube; and
   h) determining the logic state of said nanoparticle using said detected electrical resistance and said determined electrical resistance of said nanotube when said nanoparticle is in said first position, said determined electrical resistance of said nanotube when said nanoparticle is in said second position, or a combination thereof.

* * * * *

UNITED STATES PATENT AND TRADEMARK OFFICE
Certificate

Patent No. 8,130,569 B1                                                            Patented: March 6, 2012

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Alex Karlwalter Zettl, Kensington, CA (US); and Gavi Elan Begtrup, Cincinnati, OH (US).

Signed and Sealed this Twenty-second Day of October 2013.

RICHARD ELMS
*Supervisory Patent Examiner*
Art Unit 2824
Technology Center 2800